(12) United States Patent
Yokoo et al.

(10) Patent No.: US 9,503,099 B2
(45) Date of Patent: Nov. 22, 2016

(54) TEMPERATURE COMPENSATED CRYSTAL OSCILLATOR

(71) Applicant: KYOCERA Crystal Device Corporation, Higashine-shi, Yamagata (JP)

(72) Inventors: Yoshiaki Yokoo, Higashine (JP); Harushi Kenjo, Higashine (JP); Shota Takai, Higashine (JP)

(73) Assignee: KYOCERA CRYSTAL DEVICE CORPORATION, Higashine-shi, Yamagata (JP)

( * ) Notice: Subject to any disclaimer, the term of this patent is extended or adjusted under 35 U.S.C. 154(b) by 0 days.

(21) Appl. No.: 14/943,368

(22) Filed: Nov. 17, 2015

(65) Prior Publication Data

US 2016/0079986 A1 Mar. 17, 2016

Related U.S. Application Data

(62) Division of application No. 14/532,205, filed on Nov. 4, 2014, now Pat. No. 9,287,882.

(30) Foreign Application Priority Data

Nov. 7, 2013 (JP) ................................. 2013-231325
Sep. 3, 2014 (JP) ................................. 2014-179027

(51) Int. Cl.
*H03B 5/32* (2006.01)
*H01L 41/047* (2006.01)
(Continued)

(52) U.S. Cl.
CPC ............. *H03L 1/028* (2013.01); *H01L 41/047* (2013.01); *H01L 41/053* (2013.01);
(Continued)

(58) Field of Classification Search
CPC . H01L 41/047; H01L 41/053; H01L 41/083; H01L 41/0913; H01L 41/094; H03B 5/30; H03B 5/32; H03H 9/05; H03H 9/0538; H03H 9/0547; H03H 9/0552; H03H 9/0561; H03H 9/17; H03H 9/172; H03H 9/176; H03H 9/19; H03H 9/21; H03H 9/215; H03L 1/02; H03L 1/028; H03L 1/04
USPC ....... 310/311, 344, 348, 365, 366, 368, 370; 331/66, 68, 69, 154, 156, 158, 176
See application file for complete search history.

(56) References Cited

U.S. PATENT DOCUMENTS 6,229,249 B1  5/2001  Hatanaka et al.
6,998,925 B2 * 2/2006  Harima ............... H01L 51/5237
                                                    310/348

(Continued)

FOREIGN PATENT DOCUMENTS

JP  2000-049560 A  2/2000
JP  2009-194652 A  8/2009

OTHER PUBLICATIONS

U.S. Election of Species Requirement dated Jun. 9, 2015, issued in U.S. Appl. No. 14/532,205. (6 pages).
(Continued)

*Primary Examiner* — Levi Gannon
(74) *Attorney, Agent, or Firm* — Westerman, Hattori, Daniels & Adrian, LLP

(57) ABSTRACT

The temperature compensated crystal oscillator has a rectangular substrate, a frame which is provided on an upper surface of the substrate, a mounting frame which has joining pads which are provided along an outer circumferential edge of the upper surface and which is provided on a lower surface of the substrate by bonding of joining terminals which are provided along the outer circumferential edge of the lower surface of the substrate and the joining pads, a crystal element which is mounted on an electrode pad which is provided on the upper surface of the substrate in a region surrounded by the frame, an integrated circuit element which has a temperature sensor and which is mounted on a connection pad which is provided on the lower surface of the substrate in a region surrounded by the mounting frame, and a lid which is joined to the upper surface of the frame.

4 Claims, 10 Drawing Sheets

(51) Int. Cl.
  *H01L 41/053* (2006.01)
  *H01L 41/083* (2006.01)
  *H03L 1/02* (2006.01)
  *H03H 9/17* (2006.01)
  *H03H 9/05* (2006.01)
  *H01L 41/09* (2006.01)
  *H03H 9/215* (2006.01)
  *H03H 9/10* (2006.01)
  *H03L 1/04* (2006.01)

(52) U.S. Cl.
  CPC .......... *H01L 41/083* (2013.01); *H01L 41/094* (2013.01); *H01L 41/0913* (2013.01); *H03B 5/32* (2013.01); *H03H 9/0552* (2013.01); *H03H 9/0557* (2013.01); *H03H 9/0561* (2013.01); *H03H 9/1021* (2013.01); *H03H 9/17* (2013.01); *H03H 9/176* (2013.01); *H03H 9/215* (2013.01); *H03L 1/04* (2013.01)

(56) References Cited

U.S. PATENT DOCUMENTS

| | | |
|---|---|---|
| 2002/0036448 A1 | 3/2002 | Kageyama et al. |
| 2002/0036546 A1 | 3/2002 | Hatanaka et al. |
| 2002/0084858 A1 | 7/2002 | Luff |
| 2004/0056566 A1* | 3/2004 | Rubach ................ H03H 9/0547 310/348 |
| 2004/0070462 A1 | 4/2004 | Alhayek et al. |
| 2005/0040905 A1* | 2/2005 | Hatanaka ................ H03L 1/04 331/176 |
| 2005/0055814 A1* | 3/2005 | Hatanaka ................ H01L 24/97 29/25.35 |
| 2006/0139115 A1* | 6/2006 | Mizumura ............... H03B 5/36 331/176 |
| 2006/0170510 A1 | 8/2006 | Moriya |
| 2007/0126519 A1 | 6/2007 | Mizumura et al. |
| 2007/0176517 A1 | 8/2007 | Moriya et al. |
| 2007/0247030 A1* | 10/2007 | Naruse ................ H03H 9/0552 310/348 |
| 2007/0252482 A1* | 11/2007 | Sakai .................... H03H 9/0552 310/348 |
| 2008/0068102 A1 | 3/2008 | Moriya et al. |
| 2012/0319792 A1* | 12/2012 | Harima ................ H03H 9/1021 331/158 |
| 2013/0140947 A1 | 6/2013 | Niiyama et al. |
| 2013/0257549 A1* | 10/2013 | Asamura .............. H03H 9/0538 331/68 |
| 2014/0375178 A1 | 12/2014 | Yamada et al. |
| 2015/0116052 A1* | 4/2015 | Kikushima .......... H03H 9/0552 331/158 |

OTHER PUBLICATIONS

U.S. Non-Final Office Action dated Aug. 20, 2015, issued in U.S. Appl. No. 14/532,205. (13 pages).

U.S. Notice of Allowance dated Nov. 6, 2015, issued in U.S. Appl. No. 14/532,205. (8 pages).

* cited by examiner

TEMPERATURE COMPENSATED CRYSTAL OSCILLATOR

This application is a divisional application of U.S. patent application Ser. No. 14/532,205 filed Nov. 4, 2014, and is based upon and claims the benefits of priority from Japanese Patent Application No. 2014-179027 filed on Sep. 3, 2014 and Japanese Patent Application No. 2013-231325 filed on Nov. 7, 2013 the entire contents of which being incorporated herein by reference.

TECHNICAL FIELD

The present invention relates to a temperature compensated crystal oscillator which is used in electronic equipment etc.

BACKGROUND ART

A temperature compensated crystal oscillator utilizes a piezoelectric effect of a crystal element to generate a specific frequency. For example, there is proposed a temperature compensated crystal oscillator which is provided with a package which has a substrate, a first frame which is provided on an upper surface of the substrate for providing a first concave portion and a second frame which is provided on a lower surface of the substrate for providing a second concave portion; a crystal element which is mounted on electrode pads which are provided on the upper surface of the substrate; and an integrated circuit element which is provided on the lower surface of the substrate and has a temperature sensor (see for example the following Patent Literature 1).

CITATIONS LIST

Patent Literature 1: Japanese Patent Publication No. 2000-49560A

SUMMARY OF INVENTION

Technical Problem

In the temperature compensated crystal oscillator explained above, the crystal element is mounted in the first concave portion, and the integrated circuit element which has the temperature sensor is mounted in the second concave portion. When such a temperature compensated crystal oscillator is mounted on a mounting board of electronic equipment or the like, an opening of the second concave portion is closed by the mounting board. When other electronic parts which are mounted on the mounting board generate heat in that state and that heat is transferred through the mounting board to the interior of the second concave portion, air in the second concave portion is heated up by the heat. That heated air stays in the second concave portion, therefore the temperature around the integrated circuit element which has the temperature sensor sometimes ended up rising. Due to that, the temperature around the crystal element and the temperature around the integrated circuit element become different, therefore the oscillation frequency of the temperature compensated crystal oscillator was liable to end up fluctuating when performing temperature correction of the crystal element by the integrated circuit element.

The present invention was made in consideration of the above problem and has as its object is to provide a temperature compensated crystal oscillator which is capable of reducing the fluctuation of the oscillation frequency while suppressing a difference between the temperature around the integrated circuit element and the temperature around the crystal element.

Solution to Problem

A temperature compensated crystal oscillator according to one aspect of the present invention has a rectangular substrate, a frame which is provided on an upper surface of the substrate, a mounting frame which has joining pads which are provided along an outer circumferential edge of the upper surface and which is provided on a lower surface of the substrate by joining of joining terminals which are provided along the outer circumferential edge of the lower surface of the substrate and the joining pads, a crystal element which is mounted on an electrode pad which is provided on the upper surface of the substrate in a region which is surrounded by the frame, an integrated circuit element which has a temperature sensor and which is mounted on a connection pad which is provided on the lower surface of the substrate in a region which is surrounded by the mounting frame, and a lid which is joined to the upper surface of the frame.

Advantageous Effects of Invention

In the temperature compensated crystal oscillator according to one aspect of the present invention, by having the above configuration, a clearance portion is provided between the lower surface of the substrate and the upper surface of the mounting frame. Therefore, for example, when the temperature compensated crystal oscillator of the present invention is mounted on amounting board of electronic equipment or the like, even when other electronic parts which are mounted on that mounting board generate heat and that heat is transferred through the mounting board to the interior of the second concave portion, air heated up by that heat is not accumulated in the second concave portion, the heated up air is discharged to the outside through the clearance portion, and external air enters the second concave portion through the clearance portion, therefore the influence of heat with respect to the integrated circuit element which is mounted in the second concave portion and has the temperature sensor can be mitigated. Accordingly, such a temperature compensated crystal oscillator can reduce the difference between the temperature around the integrated circuit element and the temperature around the crystal element, so can reliably correct a frequency-temperature characteristic of the crystal element and thereby reduce fluctuation of the oscillation frequency.

DESCRIPTION OF EMBODIMENTS

Figure 1:
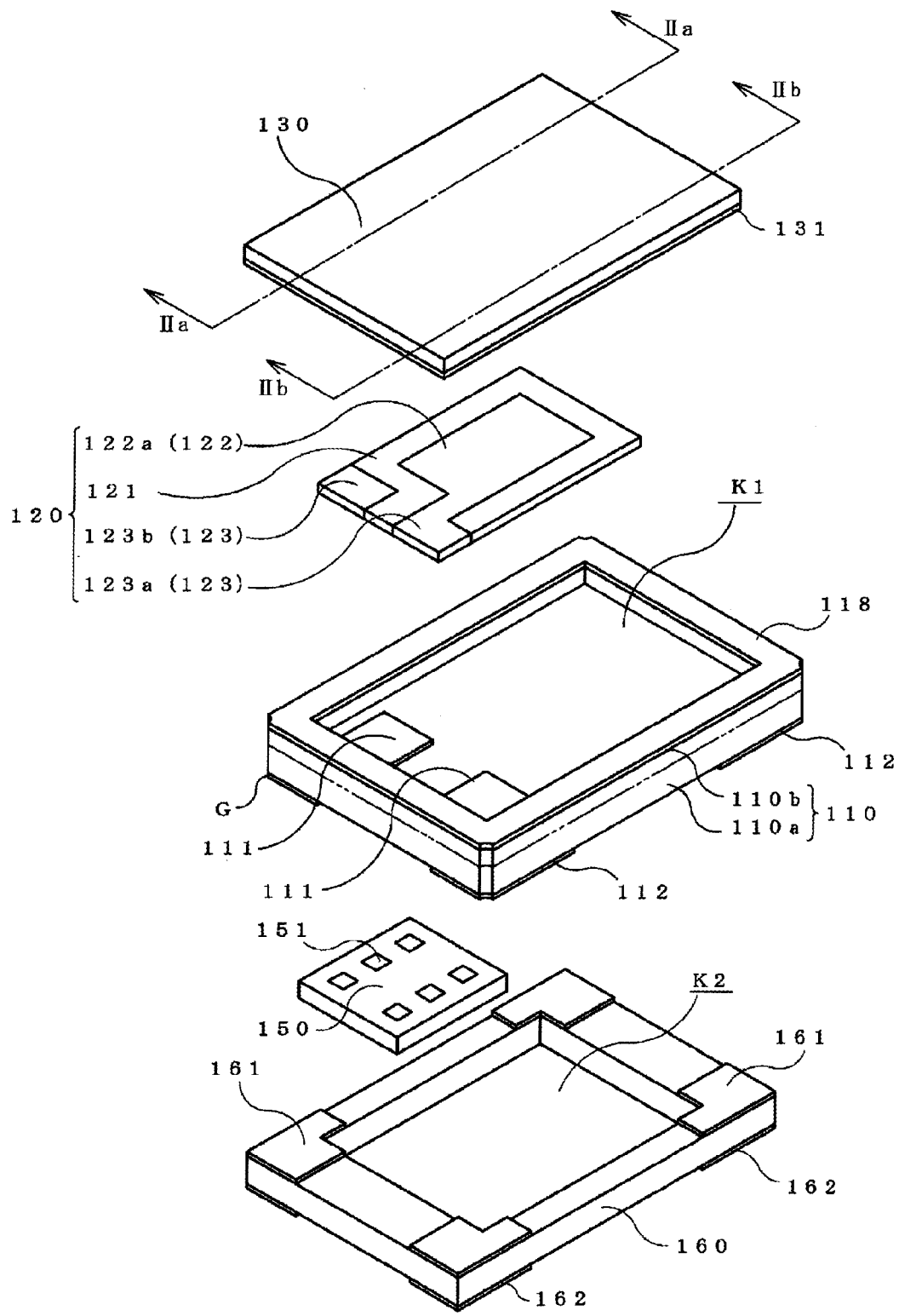
FIG. 1 is a disassembled perspective view which shows a temperature compensated crystal oscillator according to a first embodiment.

Below, crystal oscillators according to a first embodiment, a modification thereof (first modification), a second embodiment, and a modification thereof (second modification) will be explained with reference to the drawings. Note that, in the first modification and following description, configurations which are the same as or similar to the configurations already explained will be sometimes assigned the same notations as the notations attached to the configurations already explained, and explanations of them will sometimes be omitted. Further, configurations which correspond (are similar) to the configurations already explained are same as the matters which have been already explained for the corresponding configurations if matters which have not otherwise been indicated even in a case where notations different from the notations attached to the configurations already explained are attached.

First Embodiment

A temperature compensated crystal oscillator in the present embodiment, as shown in FIG. 1 to FIGS. 2A and 2B, includes a package 110, a crystal element 120 which is joined to an upper surface of the package 110, and an integrated circuit element 150 which is joined to a lower surface of the package 110. In the package 110, a first concave portion K1 which is surrounded by an upper surface of a substrate 110a and inside surfaces of a frame 110b is formed. Further, a second concave portion K2 which is surrounded by a lower surface of a substrate 110a and inside surfaces of a mounting frame 160 is formed. Such a temperature compensated crystal oscillator is used for outputting a reference signal which is used in electronic equipment etc.

The substrate 110a is rectangular in shape and functions as a mounting member for mounting the crystal element 120 which is mounted on the upper surface and the integrated circuit element 150 which is mounted on the lower surface. In the substrate 110a, electrode pads 111 for mounting the crystal element 120 are provided on the upper surface, and connection pads 115 for mounting the integrated circuit element 150 are provided on the lower surface. Further, along one side of the substrate 110a, a first electrode pad 111a and second electrode pad 111b for joining the crystal element 120 are provided. At four corners of the lower surface of the substrate 110a, joining terminals 112 are provided. Further, at the center of the lower surface of the substrate 110a, a pair of measurement pads 119 are provided, and six connection pads 115 for mounting the integrated circuit element 150 are provided so as to surround the pair of measurement pads 119. Further, the joining terminals 112 are electrically connected to four among the connection pads 115 which are located on the outer side.

The substrate 110a is configured by an insulation layer which is for example made of a ceramic material such as an alumina ceramic or a glass ceramic. The substrate 110a may be one using one insulation layer or one which is formed by laminating a plurality of insulation layers. On the surface and inside of the substrate 110a, interconnect patterns 113 and via conductors 114 for electrically connecting the electrode pads 111 which are provided on the upper surface and the measurement pads 119 which are provided on the lower surface of the substrate 110a are provided. Further, on the surface of the substrate 110a, connection patterns 116 for electrically connecting the connection pads 115 and measurement pads 119 which are provided on the lower surface and the joining terminals 112 which are provided on the lower surface of the substrate 110a are provided.

The frame 110b is arranged on the upper surface of the substrate 110a and is for forming a first concave portion K1 on the upper surface of the substrate 110a. The frame 110b is made of for example alumina ceramic or glass ceramic or other ceramic material and is formed integrally with the substrate 110a.

The electrode pads 111 are for mounting the crystal element 120. The electrode pads 111 are provided in a pair on the upper surface of the substrate 110a and are provided to be adjacent to each other along one side of the substrate 110a. The electrode pads 111, as shown in FIGS. 3A and 3B and FIGS. 4A and 4B, are electrically connected to the joining terminals 112 which are provided on the lower surface of the substrate 110a through the interconnect patterns 113 which are provided on the upper surface of the substrate 110a and via conductors 114.

Figure 3A:
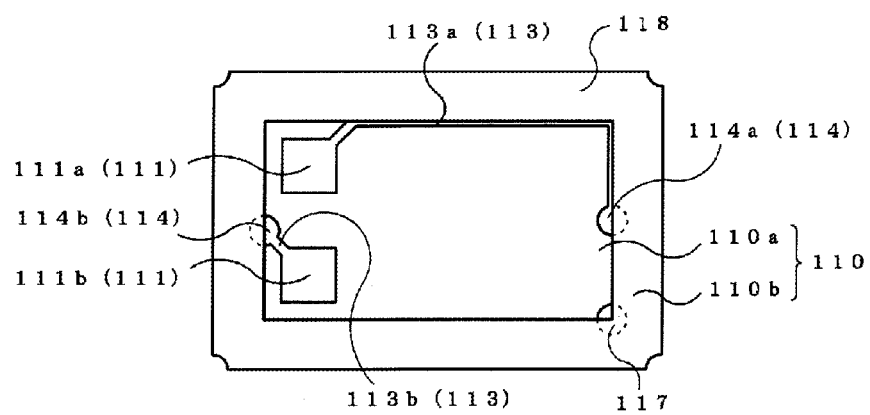
FIG. 3A is a transparent plan view when viewing a package configuring the temperature compensated crystal oscillator according to the first embodiment from the top surface, and 3B is a transparent plan view when viewing a substrate of the package configuring the temperature compensated crystal oscillator according to the first embodiment from the top surface.
Figure 3B:
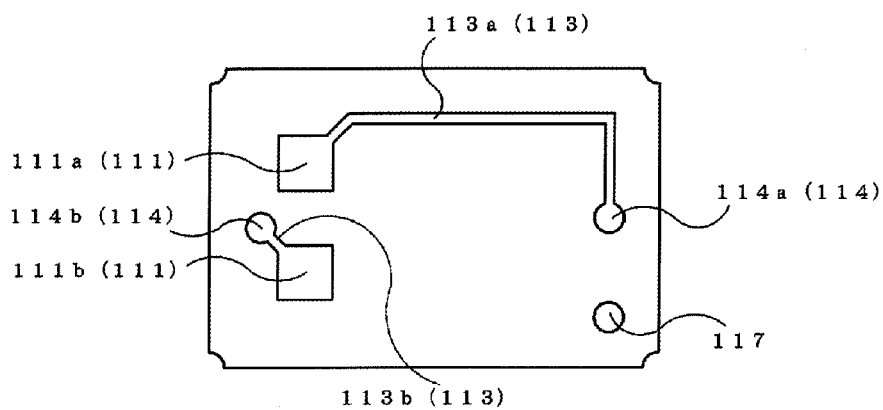

The electrode pads 111 are configured by a first electrode pad 111a and a second electrode pad 111b as shown in FIGS. 3A and 3B. The via conductors 114 are configured by a first via conductor 114a and second via conductor 114b. Further, the interconnect patterns 113 are configured by a first interconnect pattern 113a and second interconnect pattern 113b. The measurement pads 119 are configured by a first measurement pad 119a and second measurement pad 119b. The first electrode pad 111a is electrically connected to one end of the first interconnect pattern 113a provided on the substrate 110a. Further, the other end of the first interconnect pattern 113a is electrically connected through the first via conductor 114a to the first measurement pad 119a. Accordingly, the first electrode pad 111a is electrically connected to the first measurement pad 119a. The second electrode pad 111b is electrically connected to one end of the second interconnect pattern 113b which is provided on the substrate 110a. Further, the other end of the second interconnect pattern 113b is electrically connected through the second via conductor 114b to the second measurement pad 119b. Accordingly, the second electrode pad 111b is electrically connected to the second measurement pad 119b.

Figure 4A:
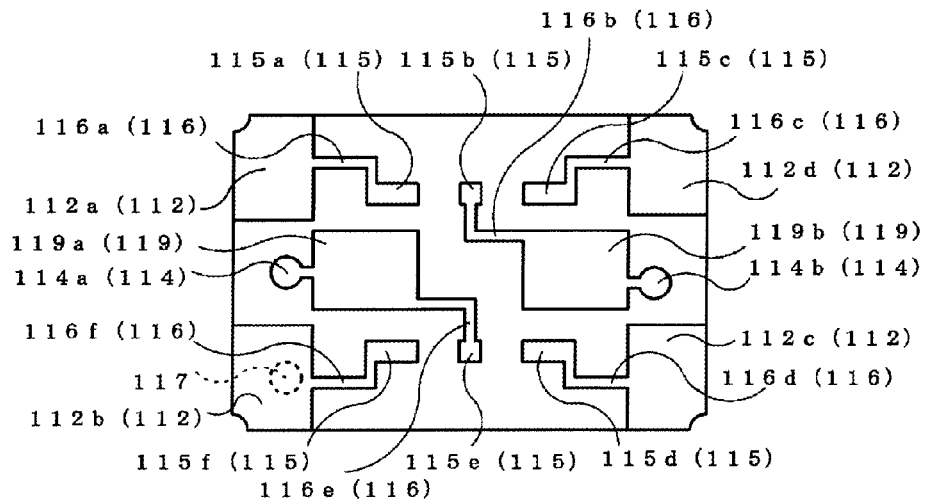
FIG. 4A is a planar transparent view when viewing the substrate of the package configuring the temperature compensated crystal oscillator according to the first embodiment from a bottom surface, and 4B is a planar transparent view when viewing the temperature compensated crystal oscillator according to the first embodiment from the bottom surface.
Figure 4B:
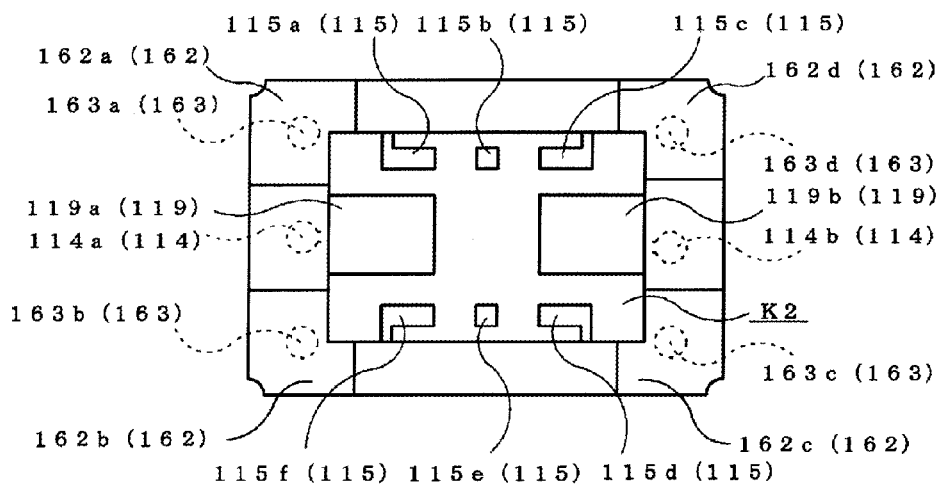

The joining terminals 112 are used for electrical joining with joining pads 161 of the mounting frame 160. The joining terminals 112, as shown in FIG. 4B, are provided at the four corners of the lower surface of the substrate 110a and are configured by a first joining terminal 112a, second joining terminal 112b, third joining terminal 112c, and fourth joining terminal 112d. The joining terminals 112 are respectively electrically connected to the connection pads 115 which are provided on the lower surface of the substrate 110a. Further, the second joining terminal 112b is electrically connected through a ground-use via conductor 117 to a sealing conductor pattern 118.

The interconnect patterns 113 are provided on the upper surface of the substrate 110a and are led out from the electrode pads 111 toward the nearby via conductors 114 of the substrate 110a. Further, the interconnect patterns 113 are configured by the first interconnect pattern 113a and second interconnect pattern 113b as shown in FIGS. 3A and 3B.

The via conductors 114 are provided inside the substrate 110a. Their two ends are electrically connected to the interconnect patterns 113 and measurement pads 119. The via conductors 114 are provided by filling conductors inside through holes which are provided in the substrate 110a. Further, the via conductors 114 are provided at positions where they overlap the mounting frame 160 as shown in FIGS. 4A and 4B when viewed on a plane. By configuring the invention in this way, in the temperature compensated crystal oscillator in the present embodiment, a floating capacitance which is generated between the mounting patterns on the mounting board of the electronic equipment or the like and the via conductors 114 can be reduced. Since the floating capacitance is not added to the crystal element 120, fluctuation of the oscillation frequency of the crystal element 120 can be reduced.

The connection pads 115 are used for mounting the integrated circuit element 150. Further, the connection pads 115, as shown in FIGS. 4A and 4B, are configured by a first connection pad 115a, second connection pad 115b, third connection pad 115c, fourth connection pad 115d, fifth connection pad 115e, and sixth connection pad 115f. The first connection pad 115a and the first joining terminal 112a are connected by a first connection pattern 116a which is provided on the lower surface of the substrate 110a, and the second connection pad 115b and the second measurement pad 119b are connected by a second connection pattern 116b which is provided on the lower surface of the substrate 110a. The third connection pad 115c and fourth joining terminal 112d are connected by a third connection pattern 116c which is provided on the lower surface of the substrate 110a, and the fourth connection pad 115d and third joining terminal 112c are connected by a fourth connection pattern 116d which is provided on the lower surface of the substrate 110a. Further, the fifth connection pad 115e and first measurement pad 119a are connected by a fifth connection pattern 116e which is provided on the lower surface of the substrate 110a, and the sixth connection pad 115f and second joining terminal 112b are connected by a sixth connection pattern 116f which is provided on the lower surface of the substrate 110a. Further, the connection patterns 116 are provided on the lower surface of the substrate 110a and are led out from the connection pads 115 toward the nearby joining terminals 112 and measurement pads 119.

The sealing conductor pattern 118, when joined with the lid 130 through the sealing member 131, plays the role of improving the wettability of the sealing member 131. The sealing conductor pattern 118, as shown in FIGS. 3A and 3B and FIGS. 4A and 4B, is electrically connected through the ground-use via conductor 117 to the second joining terminal 112b. The sealing conductor pattern 118 is formed to a thickness of for example 10 to 25 μm by sequentially applying nickel plating and gold plating to the surface of a conductor pattern made of for example tungsten or molybdenum so as to surround the upper surface of the frame 110b in a ring state.

The measurement pads 119 are for measuring the characteristics of the crystal element 120 by contacting contact pins or the like. The measurement pads 119 are configured by a first measurement pad 119a and second measurement pad 119b. The measurement pads 119 are electrically connected through the interconnect patterns 113 and via conductors 114 which are provided on the substrate 110a to the electrode pads 111 which are provided on the upper surface of the substrate 110a. The first measurement pad 119a is electrically connected through the fifth connection pattern 116e to the fifth connection pad 115e. Further, the second measurement pad 119b is electrically connected through the second connection pattern 116b to the second connection pad 115b. The measurement pads 119 are provided at positions where they overlap the integrated circuit element 150 when viewed on a plane. By configuring the invention in this way, a floating capacitance which is generated between the mounting patterns on the mounting board of the electronic equipment or the like and the measurement pads 119 is reduced. Since the floating capacitance is not added to the crystal element 120, fluctuation of the oscillation frequency of the crystal element 120 can be reduced.

Here, taking as an example a case where the dimension of one side of the package 110 when viewed on a plane is 1.0 to 2.0 mm, the size of the measurement pads 119 will be explained. The lengths of the long sides of the measurement pads become 0.5 to 0.8 mm, and the lengths of the short sides become 0.45 to 0.75 mm. Further, when measuring the crystal element 120, measurement is carried out before the mounting frame 160 is mounted. Therefore, compared with the conventional temperature compensated crystal oscillator, the areas of the measurement pads 119 can be made larger. Since the areas of the measurement pads 119 can be made larger, poor contact between the contact pins and the measurement pads 119 can be reduced. Accordingly, remeasurement of the crystal element 120 which occurs due to poor contact between the contact pins and the measurement pads 119 can be suppressed, therefore it becomes possible to improve the productivity of the temperature compensated crystal oscillator.

Further, as an electrical characteristic measuring instrument which is used when measuring the characteristics of the crystal element 120, use is made of a network analyzer or impedance analyzer etc. which is capable of measuring the resonance frequency and crystal impedance of the crystal element 120, but also the inductance, capacitance, and other equivalent parameters. The contact pins are configured by high electroconductive pins which are obtained by gold plating the surface of an alloy of copper, silver, etc. and receptacle sockets which have a spring property of suppressing impact upon contact. The measurement is carried out by making these contact the measurement pads 119 while pushing against the latter.

Here, a method of production of the substrate 110a will be explained. When the substrate 110a is made of alumina ceramic, first a plurality of ceramic green sheets which are obtained by adding and mixing a suitable organic solvent or the like to a predetermined ceramic material powder are prepared. Further, a predetermined conductor paste is coated on the surfaces of the ceramic green sheets or the inside of the through holes, which are formed in advance by punching or otherwise processing the ceramic green sheets, by conventionally known screen printing or the like. Further, these ceramic green sheets are laminated and press-shaped, then fired at a high temperature. Finally, to the predetermined regions of the conductor pattern, specifically regions which become the electrode pads 111, joining terminals 112, interconnect patterns 113, via conductors 114, connection pads 115, connection patterns 116, ground-use via conductor 117, sealing conductor pattern 118, and measurement pads 119, nickel plating, gold plating, silver-palladium, or the like is applied, and thus the substrate is produced. Further, the conductor paste is comprised of for example a sintered body of metal powder or the like. The metal powder is made of tungsten, molybdenum, copper, silver, silver-palladium or the like.

The mounting frame 160 is joined to the lower surface of the substrate 110a and is for forming the second concave portion K2 on the lower surface of the substrate 110a. The mounting frame 160 is configured by for example an insulating substrate made of glass epoxy resin and is joined with the lower surface of the substrate 110a through a conductive bonding material 170. Inside the mounting frame 160, conductors 163 for electrically connecting the joining pads 161 which are provided on the upper surface and the external terminals 162 which are provided on the lower surface of the mounting frame 160 are provided. At the four corners of the upper surface of the mounting frame 160, joining pads 161 are provided, while the external terminals 162 are provided at the four corners of the lower surface. Further, the external terminals 162 are electrically connected to the integrated circuit element 150.

Figure 5A:
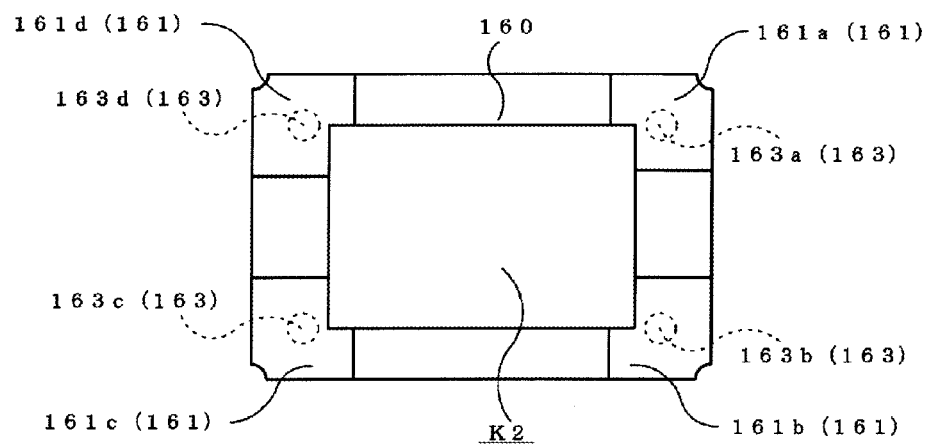
FIG. 5A is a plan view when viewing amounting frame configuring the temperature compensated crystal oscillator according to the first embodiment from the top surface, and 5B is a plan view when viewing the mounting frame configuring the temperature compensated crystal oscillator according to the first embodiment from the bottom surface.
Figure 5B:
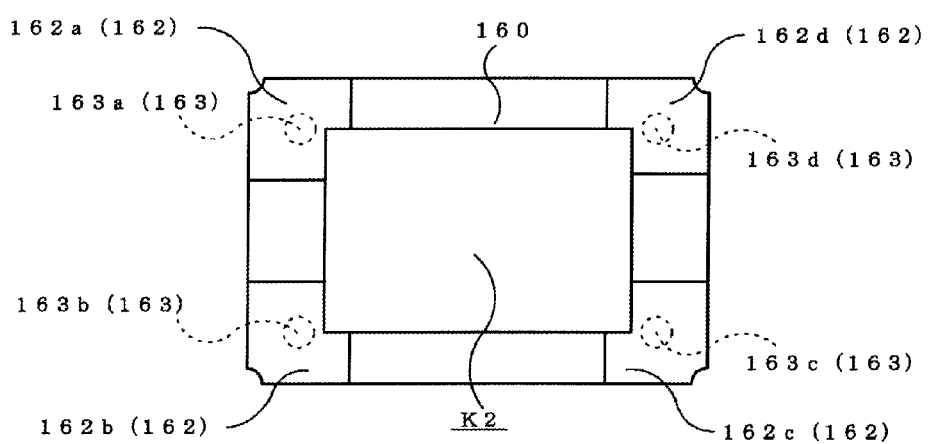

The joining pads 161 are for electrical bonding with the joining terminals 112 of the substrate 110a through the conductive bonding material 170. The joining pads 161, as shown in FIGS. 5A and 5B, are configured by a first joining pad 161a, second joining pad 161b, third joining pad 161c, and fourth joining pad 161d. Further, the external terminals 162, as shown in FIGS. 5A and 5B, are configured by a first external terminal 162a, second external terminal 162b, third external terminal 162c, and fourth external terminal 162d. The conductors 163 are configured by a first conductor 163a, second conductor 163b, third conductor 163c, and fourth conductor 163d. The first joining pad 161a is electrically connected through the first conductor 163a to the first external terminal 162a, and the second joining pad 161b is electrically connected through the second conductor 163b to the second external terminal 162b. The third joining pad 161c is electrically connected through the third conductor 163c to the third external terminal 162c, and the fourth joining pad 161d is electrically connected through the fourth conductor 163d to the fourth external terminal 162d.

The external terminals 162 are for mounting on the mounting board of electronic equipment or the like. The external terminals 162 are provided at the four corners of the lower surface of the mounting frame 160. The external terminals 162 are electrically connected to four among the six connection pads 115 which are provided on the lower surface of the substrate 110a. Further, the second external terminal 162b is connected to the mounting pad which is connected to the ground potential as the reference potential on the mounting board of the electronic equipment or the like. Due to this, the lid 130 which is joined to the sealing conductor pattern 118 is connected to the second external terminal 162b which has become the ground potential. Accordingly, a shielding property in the first concave portion K1 by the lid 130 is improved. Further, the first external terminal 162 is used as the output terminal, the third external terminal 162c is used as the function terminal, and the fourth external terminal 162d is used as the power supply voltage terminal. The function terminal is used as the writing/reading terminal and frequency control terminal. Here, the "writing/reading terminal" means a terminal which writes temperature compensation-use control data into a memory element part and loads the temperature compensation-use control data written in the memory element part. The "frequency control terminal" means a terminal for correcting the temperature characteristic of the crystal element by changing a load carrying capacity of a variable capacity diode of an oscillation circuit part when voltage is applied.

The conductors 163 are for electrically connecting the joining pads 161 on the upper surface of the substrate 110a and the external terminals 162 on the lower surface. They are formed by providing through holes at the four corners of the mounting frame 160, forming conductive members on the inner wall surfaces of the through holes, closing the top surfaces of those by the joining pads 161, and closing the bottom surfaces of those by the external terminals 162.

The shape of the opening of the second concave portion K2 becomes rectangular when viewed on a plane. Here, the size of the opening of the second concave portion K2 will be explained by taking as example a case where the dimension of the long sides of the substrate 110a is 1.2 to 2.5 mm, and the dimension of the short sides of the substrate 110a is 1.0 to 2.0 mm when viewed on a plane. The length of the long sides of the second concave portion K2 is 0.8 to 1.5 mm, and the length of the short sides of the second concave portion K2 is 0.5 to 1.2 mm.

A bonding method of the mounting frame 160 to the substrate 110a will be explained. First, the conductive bonding material 170 is for example coated on the first joining pad 161a, second joining pad 161b, third joining pad 161c, and fourth joining pad 161d by a dispenser or screen printing. The substrate 110a is conveyed so that the joining terminals 112 of the substrate 110a are positioned above the conductive bonding material 170 and then is placed on the conductive bonding material 170. Then, the conductive bonding material 170 is cured and made to shrink by heat curing. Due to this, the joining terminals 112 of the substrate 110a are joined to the joining pads 161. That is, the first joining terminal 112a of the substrate 110a is joined to the first joining pad 161a, and the second joining terminal 112b of the substrate 110a is joined to the second joining pad 161b. Further, the third joining terminal 112c of the substrate 110a is joined to the third joining pad 161c, and the fourth joining terminal 112d of the substrate 110a is joined to the fourth joining pad 161d.

Figure 2A:
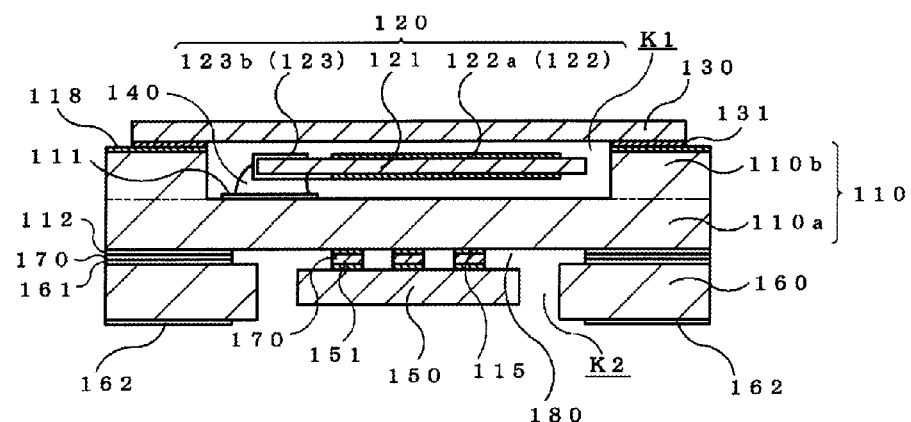
FIG. 2A is a cross-sectional view taken along IIa-IIa in FIGS. 1, and 2B is a cross-sectional view taken along IIb-IIb in FIG. 1.
Figure 2B:
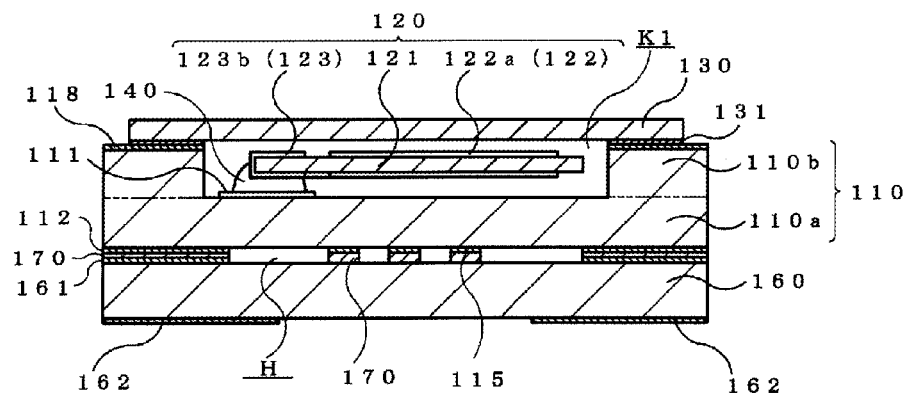

Further, by bonding of the joining terminals 112 of the substrate 110a and the joining pads 161 of the mounting frame 160 through the conductive bonding material 170, as shown in FIG. 2B, a clearance portion H having a thickness of an extent obtained by adding the thickness of the conductive bonding material 170 and the thicknesses of the joining terminals 112 and joining pads 161 is provided between the substrate 110a and the mounting frame 160. Due to this, for example, when the temperature compensated crystal oscillator of the present embodiment is mounted on the mounting board of electronic equipment or the like, even when another electronic parts such as a power amplifier which is mounted on this mounting board generates heat and that heat is transferred through the mounting board to the interior of the second concave portion K2, air which is heated up by that heat is not accumulated in the second concave portion K2, the heated air is discharged to the outside through the clearance portion H, and the external air enters into the second concave portion K2 through the clearance portion H, therefore the influence of heat with respect to the integrated circuit element 150 which has the temperature sensor in the second concave portion K2 can be mitigated. Accordingly, a difference between the temperature around the integrated circuit element 150 and the temperature around the crystal element 120 can be reduced. Therefore, by reliably correcting the frequency temperature characteristic of the crystal element 120, fluctuation of the oscillation frequency can be reduced.

Here, a method of production of the mounting frame 160 will be explained. When the mounting frame 160 is a glass epoxy resin, it is produced by impregnating a precursor of epoxy resin into a base material made of glass fiber and heat curing this epoxy resin-precursor at a predetermined temperature. Further, the predetermined regions of the conductor pattern, specifically the joining pads 161 and external terminals 162, are for example formed by transferring a copper foil formed to a predetermined shape to a resin sheet made of glass epoxy resin, laminating resin sheets to which the copper foil has been transferred, and bonding them by an adhesive. Further, the conductors 163 are formed by deposition on the inner surfaces of the through holes which are formed in the resin sheets by printing a conductor paste or plating or are formed by filling metal in the through holes. Such conductors 163 are for example formed by joining metallic foils or metal columns by resin molding or deposition by using sputtering method, vapor deposition method, or the like.

The crystal element 120 is, as shown in FIG. 1 and FIGS. 2A and 2B, joined onto the electrode pads 111 through a conductive adhesive 140. The crystal element 120 plays a role of generating a reference signal of an electronic apparatus or the like by stable mechanical vibration and a piezoelectric effect.

Further, the crystal element 120 has a structure such as shown in FIG. 1 and FIGS. 2A and 2B in which excitation-use electrodes 122 and leadout electrodes 123 are attached to the upper surface and lower surface of a crystal element plate 121. The excitation-use electrodes 122 are formed by depositing metal to each of the upper surface and lower surface of the crystal element plate 121 by predetermined patterns. The excitation-use electrodes 122 are provided with a first excitation-use electrode 122a on the upper surface and a second excitation-use electrode 122b on the lower surface. The leadout electrodes 123 are extended from the excitation-use electrodes 122 toward one side of the crystal element plate 121. The leadout electrodes 123 are provided with a first leadout electrode 123a on the upper surface and a second leadout electrode 123b on the lower surface. The first leadout electrode 123a is led out from the first excitation-use electrode 122a and is provided so as to extend toward one side of the crystal element plate 121. The second leadout electrode 123b is led out from the second excitation-use electrode 122b and is provided so as to extend toward one side of the crystal element plate 121. That is, the leadout electrodes 123 are provided in shapes along the long sides or short sides of the crystal element plate 121. Further, in the present embodiment, the crystal element 120 is fixed onto the substrate 110a by a cantilever supporting structure in which one end of the crystal element 120 which is connected to the first electrode pad 111a and second electrode pad 111b is defined as the fixed end connected to the upper surface of the substrate 110a, and the other end is defined as the free end separated from the upper surface of the substrate 110a.

Here, the operation of the crystal element 120 will be explained. The crystal element 120 is designed so that when an alternating voltage from the outside is applied from the leadout electrodes 123 through the excitation-use electrodes 122 to the crystal element plate 121, the crystal element plate 121 causes excitation at a predetermined vibration mode or frequency.

Here, a method of production of the crystal element 120 will be explained. First, the crystal element 120 is cut from a manmade crystal at a predetermined cut angle and is beveled for making the thickness of the periphery of the crystal element plate 121 thinner so that the center portion of the crystal element plate 121 becomes thicker than the periphery of the crystal element plate 121. Then, the crystal element 120 is produced by forming excitation-use electrodes 122 and leadout electrodes 123 by depositing metal films on the two major surfaces of the crystal element plate 121 by a photolithography technique, vapor deposition technique, or sputtering technique.

A bonding method of the crystal element 120 to the substrate 110a will be explained. First, the conductive adhesive 140 is for example coated on the first electrode pad 111a and second electrode pad 111b by a dispenser. The crystal element 120 is conveyed over the conductive adhesive 140 and then is placed on the conductive adhesive 140. Then, the conductive adhesive 140 is cured and made to shrink by heat curing. The crystal element 120 is thereby bonded to the electrode pads 111. That is, the first leadout electrode 123a of the crystal element 120 is bonded to the second electrode pad 111b, and the second leadout electrode 123b is bonded to the first electrode pad 111a. Due to this, the first joining terminal 112a and the third joining terminal 112c are electrically connected to the crystal element 120. Further, the first joining terminal 112a and third joining terminal 112c are bonded to the first joining pad 161a and third joining pad 161c through the conductive bonding material 170, thereby end up being electrically connected to the first external terminal 162a and third external terminal 162c. That is, the first external terminal 162a and third external terminal 162c are electrically connected to the crystal element 120.

Further, the crystal element 120 is mounted so that the first interconnect pattern 113a or first via conductor 114a is arranged at a position facing the free end of the crystal element 120. By configuring the invention in this way, even when the crystal element 120 is inclined about a portion of junction of leadout electrodes 123 of the crystal element 120 and electrode pads 111 as an axis, the free end of the crystal element 120 contacts the first interconnect pattern 113a or first via conductor 114a, therefore contact of the free end of the crystal element 120 with the upper surface of the substrate 110a can be suppressed. If a drop test is carried out in a state where the free end of the crystal element 120 contacts the substrate 110a, the free end of the crystal element 120 will be liable to be chipped. By configuring the invention in this way, fluctuation of the oscillation frequency of the crystal element 120 can be reduced while suppressing chipping of the free end side of the crystal element 120.

The conductive adhesive 140 is comprised of silicone resin or another binder in which a conductive filler constituted by conductive powder is contained. As the conductive powder, use is made of any of aluminum, molybdenum, tungsten, platinum, palladium, silver, titanium, nickel, and nickel iron or one containing a combination of the same. Further, as the binder, use is made of for example a silicone resin, epoxy resin, polyimide resin, or bismaleimide resin.

As the integrated circuit element 150, use is made of for example a rectangular flip-chip integrated circuit element which has a plurality of connection pads. On its circuit-forming surface (upper surface), provision is made of a temperature sensor for detecting the temperature state of the surroundings, a memory element part for storing the temperature compensation data for compensating for the temperature characteristic of the crystal element 120, a temperature compensation circuit part which corrects the vibration characteristic of the crystal element 120 in accordance with the temperature change based on the temperature compensation data, and an oscillation circuit part which is connected to that temperature compensation circuit part and generates a predetermined oscillation output. The output signal which is generated in this oscillation circuit part is output through the first external terminal 162a of the mounting frame 160 to the outside of the temperature compensated crystal oscillator and is utilized as for example a reference signal such as a clock signal.

The memory element part is configured by a PROM or EEPROM. Temperature compensation-use control data having values of parameters which become the basis of the following cubic function which constitutes a temperature compensation function, for example a third order component adjustment value α, a first order component adjustment value β, and 0-th order component adjustment value γ, are input from the third external terminal 162c which constitutes the writing/reading terminal and stored. In the memory element part, a register map is stored. The register map shows, when the control data is input to each address data, how the control part reads that data and outputs a signal and what operation it performs.

The temperature compensation circuit part is configured by a third order function generation circuit or fifth order function generation circuit etc. For example, in the case of the third order function generation circuit, it reads out the temperature compensation-use control data which is input to the memory element part and generates a voltage derived from the temperature compensation-use control data for each temperature by the third order function. Note that, the ambient temperature of the external portion at this time is obtained from the temperature sensor in the integrated circuit element 150. The temperature compensation circuit part is connected with the cathode of the variable capacitance diode, and a voltage from the temperature compensation circuit part is applied to the cathode. By applying the voltage from the temperature compensation circuit part to the variable capacitance diode in this way, the frequency-temperature characteristic of the crystal element 120 is corrected, whereby the frequency-temperature characteristic is flattened.

The integrated circuit element 150, as shown in FIGS. 2A and 2B, is mounted on the connection pads 115 which are provided on the lower surface of the substrate 110a through a conductive bonding material 170 made of solder or the like. Further, the connection terminals 151 of the integrated circuit element 150 are connected to the connection pads 115. The connection pads 115 are electrically connected through the connection patterns 116 to the joining terminals 112. The joining terminals 112 are electrically connected through the conductive bonding material 170 to the joining pads 161. The joining pads 161 are electrically connected through the conductors 163 to the external terminals 162. Accordingly, the connection pads 115 are electrically connected through the joining terminals 112 to the external terminals 162. The second external terminal 162b plays a role of a ground terminal by connection with a mounting pad which is connected to the ground as the reference potential on the mounting board of the electronic equipment or the like. Accordingly, one among the connection terminals 151 of the integrated circuit element 150 is connected to the ground which has the reference potential.

Further, the temperature sensor which is provided in the integrated circuit element 150 is provided so as to be positioned in the measurement pad 119 when viewed on a plane. By configuring the invention in this way, the heat which is transferred from the crystal element 120 is transferred from the electrodes pads 111 through the interconnect patterns 113 and via conductors 114 to the measurement pads 119. That heat is radiated from the measurement pads 119 and is transferred to the temperature sensor which is provided in the integrated circuit element 150. Accordingly, the temperature compensated crystal oscillator can shorten the heat conduction path, therefore the temperature of the crystal element 120 and the temperature of the integrated circuit element 150 end up becoming closer, and thus it becomes possible to further reduce the difference between the temperature which is obtained by the temperature sensor in the integrated circuit element 150 and the temperature around the crystal element 120.

The bonding method of the integrated circuit element 150 to the substrate 110a will be explained. First, the conductive bonding material 170 is for example coated on the connection pads 115 by dispenser. The integrated circuit element 150 is placed on the conductive bonding material 170. Then, the conductive bonding material 170 is melt-bonded by heating. Accordingly, the integrated circuit element 150 is bonded to the connection pads 115.

Further, the integrated circuit element 150, as shown in FIG. 1 and FIGS. 2A and 2B, is rectangular in shape and is provided with six connection terminals 151 on its lower surface. Three connection terminals 151 are provided along one side, and three others are provided along the side which faces that one side. The lengths of the long sides of the integrated circuit element 150 are 0.5 to 1.2 mm, and the lengths of the short sides become 0.3 to 1.0 mm. The length in the thickness direction of the integrated circuit element 150 becomes 0.1 to 0.3 mm.

The conductive bonding material 170 is comprised of for example a silver paste or lead-free solder. Further, the conductive bonding material 170 contains a solvent which is added for adjustment to a viscosity facilitating coating. Use is made of a lead-free solder having a ratio of composition of 95 to 97.5% of tin, 2 to 4% of silver, and 0.5 to 1.0% of copper.

The lid 130 is configured by for example an alloy containing at least one of iron, nickel, and cobalt. Such a lid 130 is for air-tight sealing of the first concave portion K1 in a vacuum state or the first concave portion K1 filled with nitrogen gas or the like. Specifically, in a predetermined atmosphere, the lid 130 is placed on the frame 110b of the package 110, a predetermined current is applied and seam welding is executed so that the sealing conductor pattern 118 of the frame 110b and the sealing member 131 of the lid 130 are welded together, thereby the lid 130 is bonded to the frame 110b. Further, the lid 130 is electrically connected through the sealing conductor pattern 118 and ground-use via conductor 117 to the second joining terminal 112b on the lower surface of the substrate 110a. The second joining terminal 112b is electrically connected through the conductive bonding material 170 to the second joining pad 161b. the second joining pad 161b is electrically connected through the second conductor 163b to the second external terminal 162b. Accordingly, the lid 130 is electrically connected to the second external terminal 162b of the mounting frame 160.

The sealing member 131 is provided at the location of the lid 130 which faces the sealing conductor pattern 118 which is provided on the upper surface of the frame 110b of the package 110. The sealing member 131 is provided by for example silver solder or Au—Sn. In the case of silver solder, its thickness is 10 to 20 µm. For example, use is made of a member having a ratio of composition of 72 to 85% of silver and 15 to 28% of copper. In the case of Au—Sn, its thickness is 10 to 40 µm. For example, use is made of a member having a ratio of composition of 78 to 82% of gold and 18 to 22% of tin.

The temperature compensated crystal oscillator in the embodiment of the present invention is provided with the rectangular substrate 110a, the frame 110b which is provided on the upper surface of the substrate 110a, and the mounting frame 160 which has joining pads 161 which are provided along the outer circumferential edge of the upper surface and which is provided on the lower surface of the substrate 110a by bonding of the joining terminals 112 which are provided along the outer circumferential edge of the lower surface of the substrate 110a and the joining pads 161. By configuring the invention in this way, a clearance portion H is provided between the lower surface of the substrate 110a and the upper surface of the mounting frame 160. Therefore, for example, in the case where the temperature compensated crystal oscillator of the present invention is mounted on the mounting board of electronic equipment or the like, even when other electronic parts mounted on that mounting board generate heat and that heat is transferred through the mounting board to the interior of the second concave portion K2, air heated up by that heat is not accumulated in the second concave portion K2, the heated-up air is discharged to the outside through the clearance portion H, and the external air enters into the second concave portion K2 through the clearance portion H, therefore the influence of heat with respect to the integrated circuit element 150 which has the temperature sensor 150 and which is mounted in the second concave portion K2 can be mitigated. Accordingly, such a temperature compensated crystal oscillator can reduce the difference between the temperature which is measured by the temperature sensor and the actual temperature around the crystal element 120. Therefore, by reliably correcting the frequency-temperature characteristic of the crystal element 120, fluctuation of the oscillation frequency can be reduced.

Further, in the temperature compensated crystal oscillator in the embodiment of the present invention, the via conductors 114 are provided at positions overlapping the mounting frame 160 when viewed on a plane. By configuring the invention in this way, a floating capacitance which is generated between the mounting patterns on the mounting board of the electronic equipment or the like and the via conductors 114 can be reduced. Since the floating capacitance is not added to the crystal element 120, fluctuation of the oscillation frequency of the crystal element 120 can be reduced.

Further, in the temperature compensated crystal oscillator in the embodiment of the present invention, the measurement pads 119 are provided at positions overlapping the integrated circuit element 150 when viewed on a plane. By configuring the invention in this way, a floating capacitance which is generated between the mounting patterns on the mounting board of the electronic equipment or the like and the measurement pads 120 can be reduced. Since the floating capacitance is not added to the crystal element 120, fluctuation of the oscillation frequency of the crystal element 120 can be further reduced.

(First Modification)

Below, a temperature compensated crystal oscillator in a first modification of the present embodiment will be explained. Note that, in the temperature compensated crystal oscillator in the first modification of the present embodiment, the same portions as those in the temperature compensated crystal oscillator explained above will be assigned the same notations and explanations of them will be omitted. The temperature compensated crystal oscillator in the first modification of the present embodiment differs from the present embodiment in the point that, as shown in FIGS. 6A and 6B, an insulating resin 180 is provided in the clearance portion H which is provided between the lower surface of the substrate 110a and the upper surface of the mounting frame 160 and in a space between the integrated circuit element 150 and the connection pads 115.

Figure 6A:
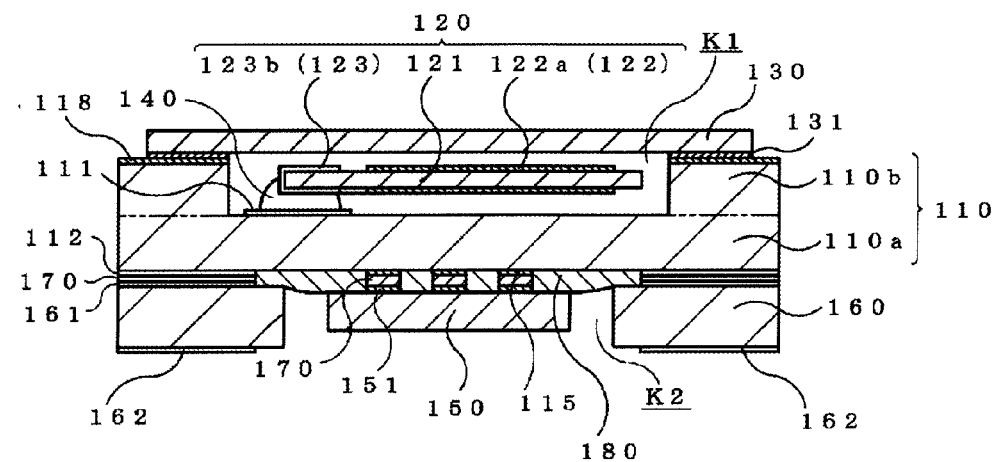
FIG. 6A is a cross-sectional view which shows the vicinity of an integrated circuit element of a temperature compensated crystal oscillator according to a first modification, and 6B is a cross-sectional view which shows the vicinity of a mounting frame of the temperature compensated crystal oscillator according to the first modification.

The insulating resin 180, as shown in FIG. 6A, is provided between the surface of the integrated circuit element 150 which is provided with the connection terminals 151 and the connection pads 115. By configuring the invention in this way, the insulating resin 180 can raise the bonding strength between the integrated circuit element 150 and the lower surface of the substrate 110a. Further, even if solder or another foreign substance enters into the second concave portion when mounting the temperature compensated crystal oscillator on the mounting pads of the mounting board of electronic equipment or the like, deposition of that foreign substance between the connection terminals 151 of the integrated circuit element 150 is suppressed by the insulating resin 180, therefore short-circuiting between the connection terminals 151 of the integrated circuit element 150 can be reduced. Further, the insulating resin 180 is made of epoxy resin or composite resin containing epoxy resin as a principal ingredient or another resin material.

Further, the insulating resin 180 is provided so as to cover the measurement pads 119. By configuring the invention in this way, deposition of foreign substance upon the measurement pads 119 is suppressed, therefore addition of added resistance of that foreign substance to the crystal element 120 can be suppressed. Accordingly, it becomes possible to reduce fluctuation of the oscillation frequency of the crystal element 120.

Figure 6B:
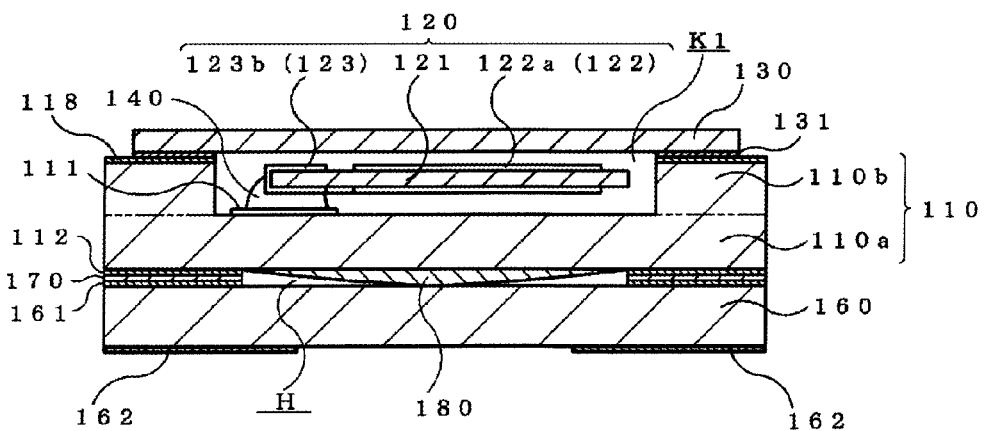

The insulating resin 180, as shown in FIG. 6B, is provided in the clearance portion H which is provided between the lower surface of the substrate 110a and the upper surface of the mounting frame 160. By configuring the invention in this way, the insulating resin 180 can improve the bonding strength between the lower surface of the substrate 110a and the upper surface of the mounting frame 160. Further, the insulating resin 180 is provided on the lower surfaces of the via conductors 114, so the outer circumferential edges of the lower surfaces of the via conductors 114 will be fixed to the substrate 110a by the insulating resin 180. By configuring the invention in this way, even if warping etc. of the substrate 110a occur, since the via conductors are fixed by the insulating resin 180, peeling-off of the via conductors 114 from the interface between the outer circumferential edges of the via conductors 114 and the substrate 110a can be reduced. Further, by reducing peel-off of the via conductors 114 from the interface between the outer circumferential edges of the via conductors 114 and the substrate 110a, a clearance is not formed in the interface between the via conductors 114 and the substrate 110a, therefore air-tightness of the substrate 110a can be improved.

The method of formation of the insulating resin 180 onto the substrate 110a will be explained. The tip end of the resin dispenser is inserted into the clearance of the second concave portion K2, and the insulating resin 180 is injected. Next, the insulating resin 180 is heated and hardened. Accordingly, the insulating resin 180 is provided in the clearance portion H which is provided between the lower surface of the substrate 110a and the upper surface of the mounting frame 160 and the space between the integrated circuit element 150 and the connection pads 115.

In the temperature compensated crystal oscillator in the first modification of the present embodiment, the insulating resin 180 is provided in the clearance portion H which is provided between the lower surface of the substrate 110a and the upper surface of the mounting frame 160 and the space between the integrated circuit element 150 and the connection pads 115. By configuring the invention in this way, the bonding strength between the integrated circuit element 150 and the lower surface of the substrate 110a can be raised. Further, in the temperature compensated crystal oscillator in the first modification of the present embodiment, the insulating resin 180 is provided in the clearance portion H which is provided between the lower surface of the substrate 110a and the upper surface of the mounting frame 160. By configuring the invention in this way, the insulating resin 180 can improve the bonding strength between the lower surface of the substrate 110a and the upper surface of the mounting frame 160.

In the temperature compensated crystal oscillator in the first modification of the present embodiment, the insulating resin 180 is provided so as to close the lower surfaces of the via conductors 114, therefore the outer circumferential edges of the lower surfaces of the via conductors 114 are fixed to the substrate 110a by the insulating resin 180, therefore the air-tightness of the substrate 110a can be improved while suppressing peel-off of the via conductors 114 from the interface between the outer circumferential edges of the via conductors 114 and the substrate 110a due to warping of the substrate 110a or the like.

Second Embodiment

Below, a second embodiment and its modification will be explained with reference to FIG. 7 to FIGS. 10A and 10B. Note that, for the purpose of clarifying the interrelationship among the drawings, an orthogonal coordinate system xyz will be sometimes attached to the drawings for convenience. An x-axis, y-axis, and z-axis are defined for convenience based on the shapes etc. of the members and do not mean an electrical axis, mechanical axis, and optical axis of the piezoelectric substance (crystal).

(Configuration of Crystal Oscillator)

Figure 7:
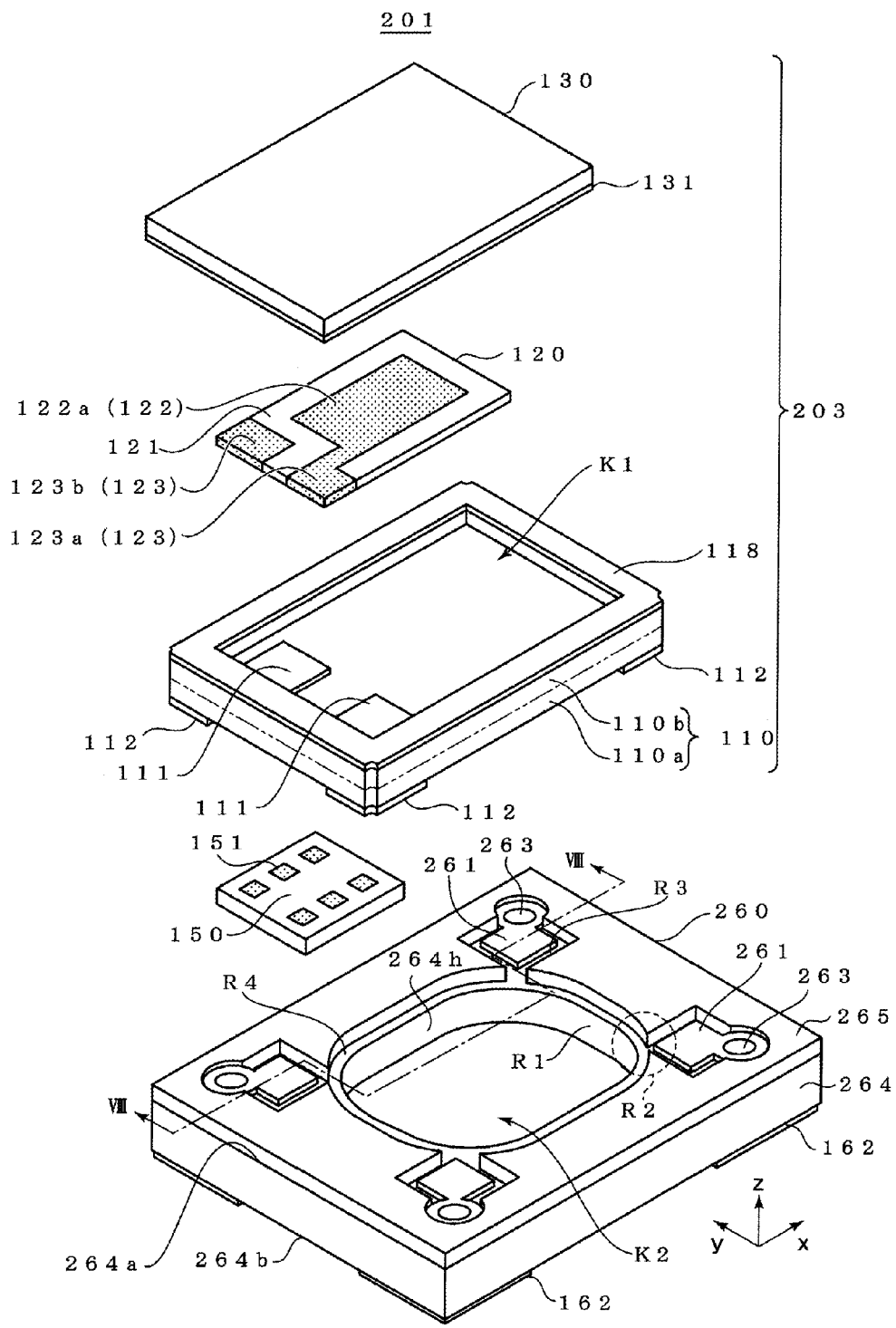
FIG. 7 is a disassembled perspective view which shows a schematic configuration of a crystal oscillator according to a second embodiment.
Figure 8:
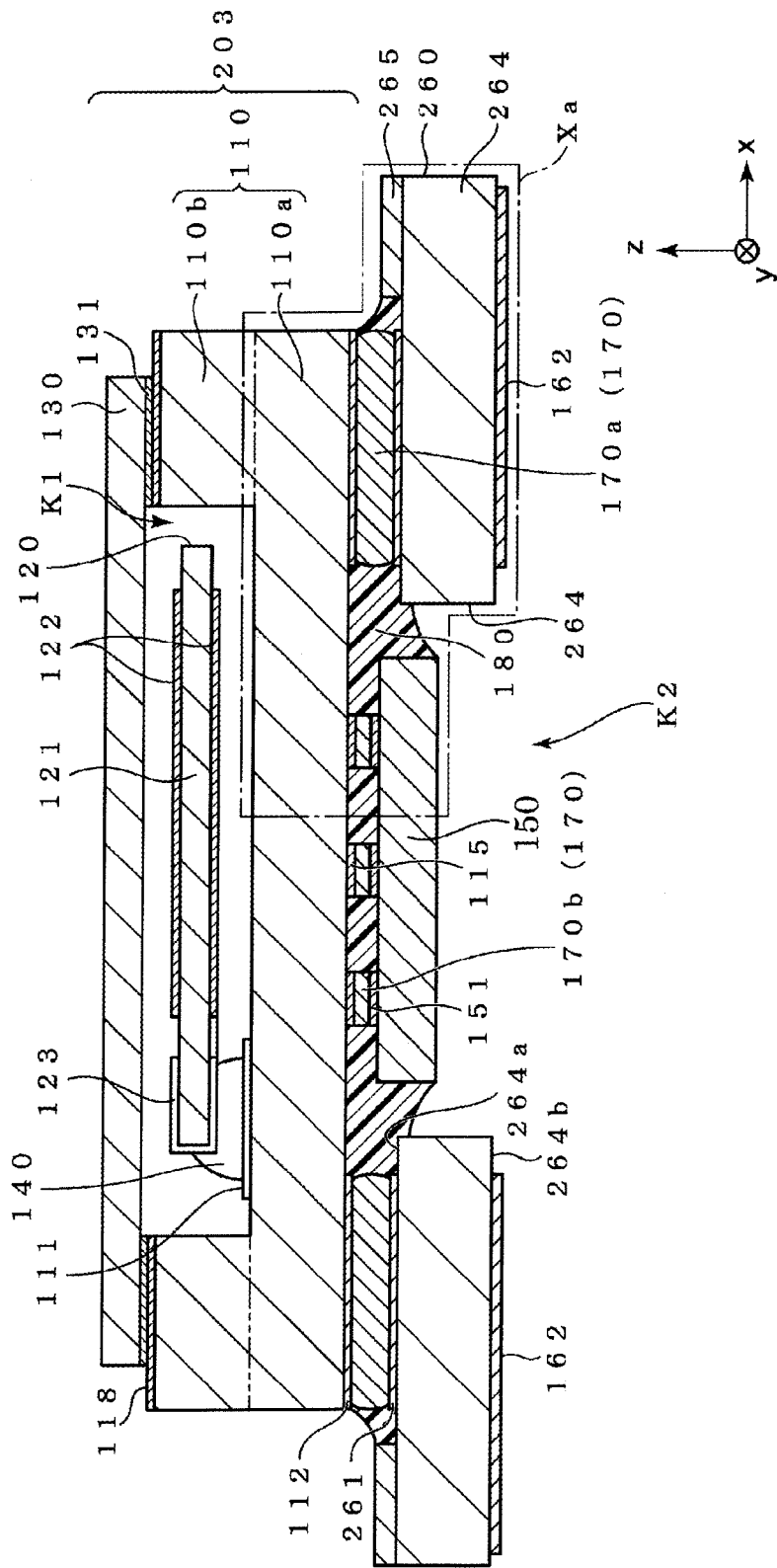
FIG. 8 is a cross-sectional view taken along a VIII-VIII line in FIG. 7.

FIG. 7 is a disassembled perspective view which shows a schematic configuration of a crystal oscillator 201 (hereinafter, "crystal" will be omitted) according to a second embodiment. FIG. 8 is a cross-sectional taken along a VIII-VIII line in FIG. 7.

In the oscillator 201, mainly, the configuration of a mounting frame 260 differs from that in the first embodiment. The rest is basically the same as in the first embodiment. Note that, in the explanation of the present embodiment, a range including the package 110, crystal element 120, and lid 130 will be sometimes referred to as a "vibrator 203". Further, for the mounting frame, the insulator portion and the combination of the insulator portion and conductor portion will be explained clearly differentiated from each other. Specifically, the mounting frame 260 designates a portion including an insulation substrate 264, external terminals 162, joining pads 261 etc.

The mounting frame 260 may be given for example the same configuration as that for a rigid type printed circuit board. For example, the mounting frame 260 has the insulation substrate 264, various types of conductors (for example metal) provided on the insulation substrate 264, and a solder resist 265 for reducing short-circuiting of various types of conductors. The various types of conductors are for example a plurality of (four in the present embodiment) joining pads 261 for mounting the vibrator 203 on the mounting frame 260, a plurality of (four in the present embodiment) external terminals 162 for mounting the mounting frame 260 on a not shown circuit board, and a plurality of (four in the present embodiment) through-hole conductors 263 (FIG. 7) for connecting the plurality of joining pads 261 and the plurality of external terminals 162.

The insulation substrate 264 is made of for example a glass epoxy material. The insulation substrate 264 (mounting frame 260) has a first major surface 264a, a second major surface 264b on its back surface, and an opening 264h (second concave portion K2) penetrating from the first major surface 264a to the second major surface 264b. The planar shapes of the insulation substrate 264 and opening 264h may be suitably set. For example, the external form of the insulation substrate 264 is rectangular. Further, for example the shape of the opening 264h is rectangular having chamfered corner parts.

The plurality of joining pads 261 are for example provided in a layer state on the four corners sides of the first major surface 264a and surround the opening 264h. The plurality of external terminals 162 are for example provided in a layer state at the four corners of the second major surface 264b and surround the opening 264h. The through-hole conductors 263 are for example positioned nearer the four corner sides of the first major surface 264a than the plurality of joining pads 261 and are provided in a layer state on the inner circumferential surfaces of the through holes which penetrate through the insulation substrate 264 from the first major surface 264a to the second major surface 264b.

The planar shapes of the joining pads 261 and external terminals 162 and the shapes of the connection conductors for these and the through-hole conductors 263 may be suitably set. In the present embodiment, the joining pads 261 and external terminals 162 are formed in rectangular shapes and are directly connected to circular lands around the through holes. Note that, since the corner parts of the opening 264h are chamfered, portions (corner parts) of the plurality of joining pads 261 and external terminals 162 on the opening 264h side are positioned nearer the opening 264h side than virtual corner parts of them in a case where the corner parts of the opening 264h are not chamfered.

The solder resist 265 is generally made of a thermosetting resin (for example epoxy resin) which contains a pigment etc. Note, in the present application, the term "solder resist" widely designates a coating film made of an insulating resin. For example, it may not contain a pigment either. The solder resist 265 for example covers the first major surface 264a while exposing the plurality of joining pads 261. Note that, the solder resist 265 may cover the second major surface 264b while exposing the external terminals 162 or may cover the side surfaces of the insulation substrate 264.

The vibrator 203 is fixed and electrically connected to the mounting frame 260 by bonding the plurality of joining terminals 112 which are provided on the package 110 and the joining pads 261 by the first conductive bonding material 170a (conductive bonding material 170, bumps, FIG. 8). The joining pads 261 are arranged so as to surround the opening 264h, therefore the vibrator 203 is mounted on the mounting frame 260 so as to cover the opening 264h from the first major surface 264a side. Note that, the area of the vibrator 203 is for example larger than the area of the opening 264h, so the opening 264h is contained in the vibrator 203 when viewed on a plane.

Further, the integrated circuit element 150 which is mounted in a region of the vibrator 203 which is surrounded by the joining pads 261 is accommodated in the opening 264h. Note that, in FIG. 8, the top side (surface on the negative side of the z-direction) of the integrated circuit element 150 is positioned nearer the internal portion side (positive side of the z-direction) than the second major surface 264b, but the top side may form roughly a flush surface together with the second major surface 264b as well.

As shown in FIG. 8, the insulating resin 180 (underfill) is filled between the integrated circuit element 150 and the vibrator 203. The insulating resin 180 is made of for example a thermosetting resin (for example epoxy resin). The insulating resin 180 may contain a filler (made of for example $SiO_2$) having a lower thermal expansion coefficient than the resin as well. The insulating resin 180 may be provided so as to cover the side surfaces of the integrated circuit element 150 up to a suitable height or may be provided so as to cover not only the side surfaces of the integrated circuit element 150, but also the top side of that.

The substrate 110a faces the insulation substrate 264 of the mounting frame 260 through a clearance corresponding to the thickness of the joining terminals 112, first conductive bonding material 170a, and joining pads 261. The insulating resin 180 spreads from the interior of the opening 264h to the clearance between the substrate 110a and the insulation substrate 264 as well.

Figure 9:
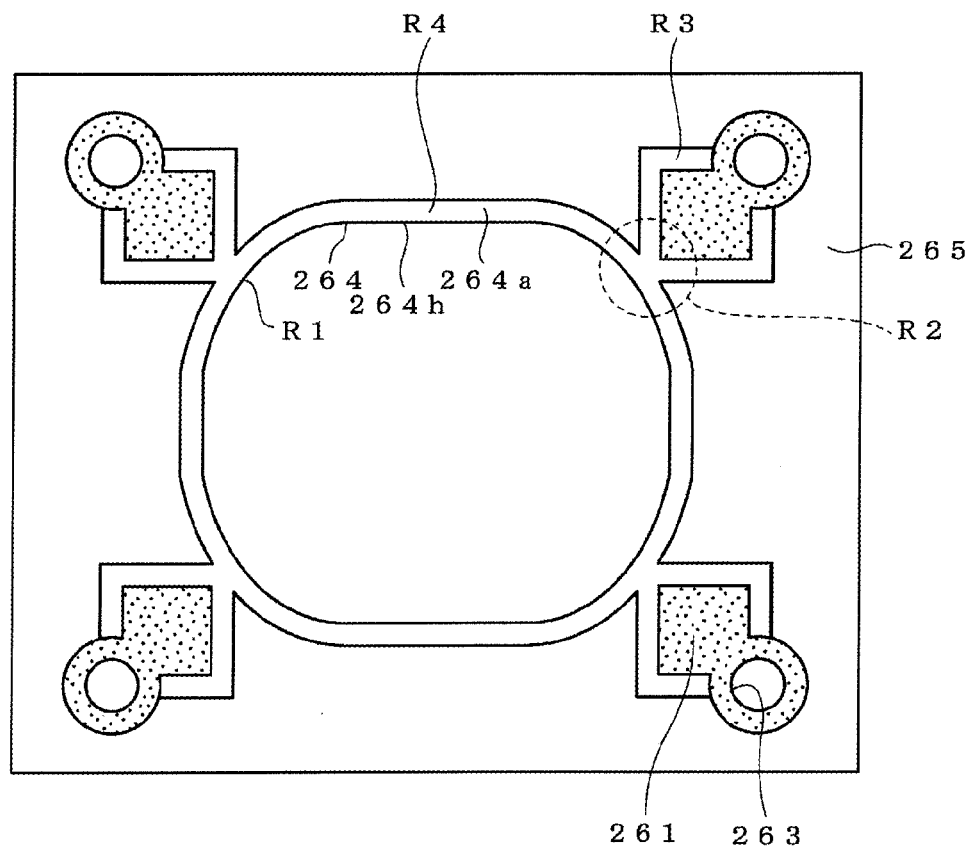
FIG. 9 is a plan view of a mounting frame of a crystal oscillator in FIG. 7.

FIG. 9 is a plan view of the first major surface 264a side of the mounting frame 260.

As shown in FIG. 7 and FIG. 9, on the mounting frame 260, other than the regions of arrangement of the joining pads 261, regions of non-arrangement of solder resist 265 are provided. Specifically, this is as follows.

First, the inner circumferential surface of the opening 264h has a first nonarrangement region R1 in which the solder resist 265 is not arranged. The first nonarrangement region R1 is made for example the entire inner circumferential surface of the opening 264h.

Further, the first major surface 264a has, as nonarrangement regions in which the solder resist 265 is not arranged, second nonarrangement regions R2 which connect the opening 264h and the joining pads 261, third nonarrangement regions R3 which are adjacent to the joining pads 261 and surround the joining pads 261, and a fourth nonarrangement region R4 which is adjacent to the opening 264h and surround the opening 264h.

The second nonarrangement regions R2 are configured by the intersecting parts of the third nonarrangement regions R3 and the fourth nonarrangement region R4 in the present embodiment (are included in the third nonarrangement regions R3 and the fourth nonarrangement region R4).

The third nonarrangement regions R3 are for example made shapes (groove shapes) that extend with roughly constant widths along the edges of the joining pads 261. The third nonarrangement regions R3 for example surround the joining pads 261 except at the connection portions with the through-hole conductors 263 of the joining pads 261. Note that, the term "surround" referred to here need only mean that for example the third nonarrangement regions R3 extend over at least half of the edges of the joining pads 261.

The fourth nonarrangement region R4 is for example made shape (groove shape) that extends with roughly constant width along the edge of the opening 264h. Note that, the extended shape may be discrete such as broken lines as well. The fourth nonarrangement region R4 surrounds for example the entire opening 264h. Note that, the term "surround" referred to here need only mean that for example one or more portions of the fourth nonarrangement region R4 extend over at least half of the edges of the opening 264h or the fourth nonarrangement region R4 is positioned in at least a portion of each section obtained by equally dividing the margin of the opening 264h to three or more sections with the central angle of 120° or less.

The widths of the second nonarrangement regions R2 to the fourth nonarrangement region R4 may be suitably set. For example, the widths are 30 µm to 200 µm. The widths may be smaller or larger than the thickness of the solder resist 265.

Figure 10A:
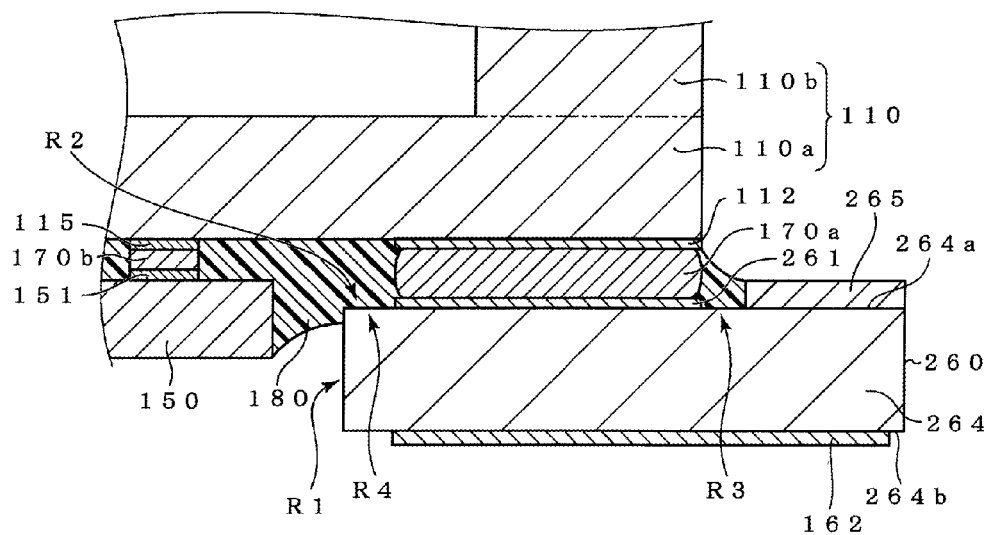
FIG. 10A is an enlarged view of a region X in FIGS. 8, and 10B is a diagram corresponding to 10A of the crystal oscillator according to a second modification.

FIG. 10A is an enlarged view of the region X in FIG. 8.

The solder resist 265 is for example formed thicker than the joining pads 261 (and other conductive layers on the first major surface 264a). For example, in a case where the thicknesses of the joining pads 261 are 10 µm to 40 µm, the thickness of the solder resist 265 is thicker than this by 5 µm or more and is 15 µm to 100 µm.

As explained above, the insulating resin 180 spreads from the interior of the opening 264h to the clearance between the substrate 110a and the insulation substrate 264 of the mounting frame 260 as well. More specifically, the insulating resin 180, in the second nonarrangement regions R2 to the fourth nonarrangement region R4, spreads between the substrate 110a and the insulation substrate 264 and contacts these members. Further, the insulating resin 180 contacts the joining pads 261, first conductive bonding material 170a, and joining terminals 112 as well. Note that, although not particularly shown, the insulating resin 180 may spread between the solder resist 265 and the substrate 110a and contact these members as well. The clearance between the package 110 and the mounting frame 260, which communicates the second concave portion K2 and the external portion, may be completely closed or not completely closed.

(Method of Production of Crystal Oscillator)

The method of production of the crystal oscillator having the above configuration will be explained.

First, the members shown in the disassembled perspective view in FIG. 7, that is, the mounting frame 260, integrated circuit element 150, package 110, crystal element 120, and lid 130, are prepared. The methods of production of these members may be the same as the known methods or first embodiment except the concrete shapes etc.

Next, the members are bonded. That is, the crystal element 120 is bonded to the package 110, the lid 130 is bonded to the package 110, the integrated circuit element 150 is bonded to the package 110, and the package 110 is bonded to the mounting frame 260.

The order of these bonding operations may be any order of bonding so far as the bonding of the lid 130 with respect to the package 110 is later than the bonding of the crystal element 120 with respect to the package 110. Further, for example, when inspecting the characteristics of the crystal element 120 through the measurement pads 119 (on which the integrated circuit element 150 is superimposed) and the adjusting the weight of the excitation-use electrodes 122 in accordance with this, the bonding of the integrated circuit element 150 to the package 110 is made later than the bonding of the crystal element 120 to the package 110.

Next, the insulating resin 180 in the uncured state is filled between the integrated circuit element 150 and the vibrator 203 through the opening 264h. The filling operation is carried out by for example a dispenser.

At this time, in the insulating resin 180 in the uncured state, the wettability with respect to the insulation substrate 264 (first major surface 264a) is higher than the wettability with respect to the solder resist 265. In addition/otherwise, in the nonarrangement regions of the solder resist 265, in the corner parts formed by the first major surface 264a and the side surfaces of the solder resist 265 or in grooves configured by the first major surface 264a and two side surfaces of the solder resist 265, a capillary phenomenon drawing in the solder resist 265 occurs. As a result, the insulating resin 180 spreads onto the second nonarrangement regions R2 to the fourth nonarrangement region R4 with a higher priority than the top of the solder resist 265.

After that, the insulating resin 180 is cured by an ordinary temperature atmosphere or by heating by a reflow furnace or the like.

(Second Modification)

Figure 10B:
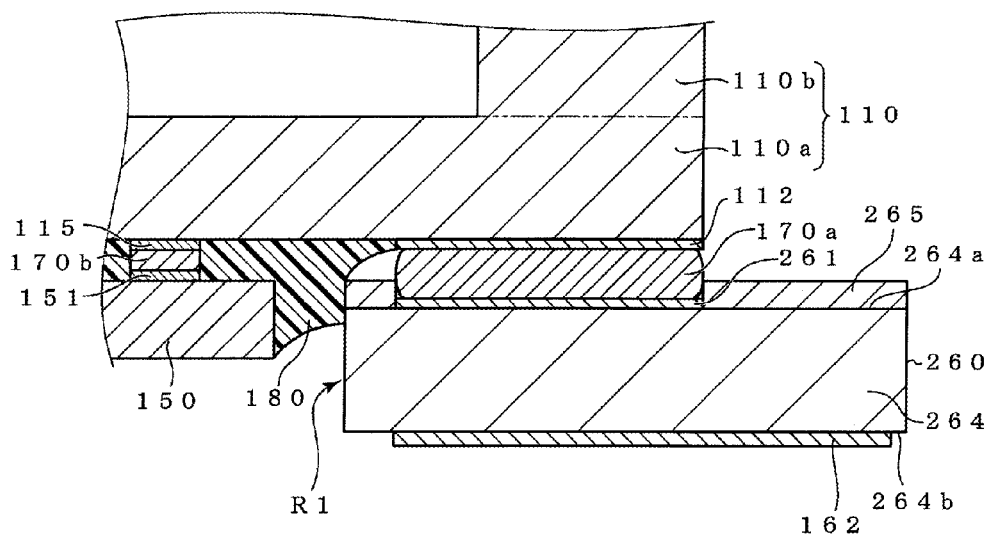

FIG. 10B is a cross-sectional view corresponding to FIG. 10A and shows a second modification.

In the second modification, a first nonarrangement region R1 is formed, but the second nonarrangement regions R2 to the fourth nonarrangement region R4 are not formed. In this case, when the insulating resin 180 in an uncured state is supplied to the opening 264h, the solder resist 265 which is positioned on the opening 264h side functions as a dam against the flow of the insulating resin 180 which flows along the first major surface 264a. As a result, the insulating resin 180 does not reach the joining pads 261.

As described above, in the present embodiment, the oscillator 1 has the mounting frame 260 having the opening 264h which penetrates from the first major surface 264a to the second major surface 264b, the vibrator 203 which is mounted on the first major surface 264a so as to cover the opening 264h, and the integrated circuit element 150 which is arranged in the opening 264h and is mounted on the vibrator 203. The mounting frame 260 has the insulation substrate 264 having the first major surface 264a, second major surface 264b, and opening 264h; the joining pads 261 which are provided on the first major surface 264a and on which the vibrator 203 is mounted; and the solder resist 265 which covers over the insulation substrate 264 while exposing the joining pads 261. The inner circumferential surface of the opening 264h has the first nonarrangement region R1 in which the solder resist 265 is not arranged.

Accordingly, for example, the package of the oscillator 201 can be configured by the combination of the package 110 of the vibrator 203 and the mounting frame 260. As a result, for example, by change or exchange of the mounting frame 260, the arrangement and size of the external terminals 162 can be conveniently changed. Further, for example, compared with the case where both of the vibrator and the integrated circuit element are mounted on the circuit board to configure the oscillator, a reduction in size is achieved since the integrated circuit element 150 is accommodated in the opening 264h.

Further, the solder resist 265 is not arranged on the inner circumferential surface of the opening 264h, therefore the inner diameter of the opening 264h can be substantially made larger to 2 times the thickness of the solder resist 265, therefore the area of the opening 264h can be substantially made larger by that extent. As a result, a reduction of size of the mounting frame 260 or mounting of a larger integrated circuit element 150 becomes possible.

Further, in the present embodiment, the oscillator 1 further has the insulating resin 180 which is filled between the vibrator 3 and the integrated circuit element 150 in the opening 264h. The vibrator 3 is mounted on the first major surface 264a in a state where a clearance is formed between the vibrator 3 and the first major surface 264a. The first major surface 264a has the second nonarrangement regions R2 on which the solder resist 265 is not arranged and connecting the opening 264h and joining pads 261. The insulating resin 180 reaches the joining pads 261 from the opening 264h through the second nonarrangement regions R2.

Accordingly, for example, the insulation substrate 264 and the vibrator 203 are bonded by the insulating resin 180 for sealing the integrated circuit element 150, therefore the bonding strength of the two can be improved. The improvement of the bonding strength is achieved in the second nonarrangement regions R2 which extend to the joining pads 261, therefore the reliability of the electrical connection between the joining pads 261 and the joining terminals 112 can be improved. As a result, for example, the reliability of the oscillator 1 can be improved at a low cost and with a smaller size. As understood from comparison with the second modification in FIG. 10B, due to the formation of the second nonarrangement regions R2, the insulating resin 180 can be made to reach the joining pads 261 more reliably.

Further, in the present embodiment, on the first major surface 264a, in addition to the second nonarrangement regions R2 described above, provision is made of the third nonarrangement regions R3 in which the solder resist 265 is not arranged and which are adjacent to the joining pads 261 and surround the joining pads 261. The insulating resin 180 spreads from the second nonarrangement regions R2 to the third nonarrangement regions R3.

Accordingly, for example, the bonding strength of the insulation substrate 264 and the vibrator 203 is improved around the joining pads 261 by the insulating resin 180. As a result, the reliability of the electrical connection between the joining pads 261 and the joining terminals 112 explained above can be improved more.

Further, in the present embodiment, the first major surface 264a has the fourth nonarrangement region R4 in which the solder resist 265 is not arranged and which is adjacent to the opening 264h and surround the opening 264h. The insulating resin 180 spreads from the opening 264h to the top of the fourth nonarrangement region R4.

Accordingly, for example, the insulating resin 180 which contacts the integrated circuit element 150 is engaged with respect to the mounting frame 260 from the first major surface 264a side to the second major surface 264b side. As a result, for example, it is suppressed that a force which separates the connection terminals 151 of the integrated circuit element 150 from the joining pads 115 of the vibrator 203 is applied to the joining pad 115. That is, by just forming the fourth nonarrangement region R4, the reliability of the electrical connection of the oscillator 201 can be improved.

Note that, the invention is not limited to the present embodiments. Various alterations and modifications are possible insofar as they are within a range not out of the gist of the present invention. In the embodiments described above, cases where AT-use crystal elements were used as the crystal elements were explained, but use may be made of a tuning fork type flexural crystal having a base portion and two flat plate-shaped vibrating arm portions which extend from the side surfaces of the base portion in the same direction.

Further, a beveling method of the crystal element 120 will be explained. An abrasive material provided with media and abrasive grains having predetermined grain size and a crystal element plate 121 formed in a predetermined size are prepared. The prepared abrasive material and crystal element plate 121 are put into a cylindrical body, and an opening end part of the cylindrical body is closed by a cover. When the cylindrical body in which the abrasive material and crystal element plate 121 are put is rotated using the center axis of the cylindrical body as the center of rotation, the crystal element plate 121 is polished by the abrasive material and thus the beveling is carried out.

In the embodiments described above, cases where the frame 110b was integrally formed by a ceramic material in the same way as the substrate 110a were explained, but the frame 110b may be made of metal. In this case, the frame is bonded to the conductive film of the substrate through a silver-copper or other brazing material.

Further, in the embodiments described above, cases where the conductors 163 or through-hole conductors 263 were provided inside the substrate were explained, but they may be provided inside notches provided in the corner parts of the mounting frame 160 as well. At this time, the conductors are provided by printing the conductor paste in the notches.

The mounting frame may have a conductor layer which is parallel to the major surfaces not only on the major surfaces, but also in its internal portion. Further, for example the mounting frame may have laminar interconnects etc. on the first major surface and/or second major surface and have solder resist so as to cover the interconnects etc.

The mounting frame is not limited to one having a configuration which is provided with an insulation substrate having roughly the same size as that of the vibrator when viewed on a plane and laminar external terminals provided on the second major surface. That is, the mounting frame is not limited to one having a shape like a so-called H-type package together with the package of the vibrator. For example, the mounting frame may be one having a relatively broad area wherein suitable electronic parts are mounted on the first major surface parallel to the vibrator. Further, for example, the mounting frame may be one in which a heater or another electronic part is mounted on the second major surface so as to cover the opening as well. Further, for example, the mounting frame may be one wherein laminar external terminals are not provided on the second major surface, but pin-shaped external terminals are inserted into the through-hole conductors (263) to be fixed.

In the mounting frame in the second embodiment, not all of the first nonarrangement region to the fourth nonarrangement region need be formed. For example, any one, any two, or any three among the first nonarrangement region to the fourth nonarrangement region may be formed. Note, when considering the flow of the underfilling in an uncured state which flows along the insulation substrate, preferably the second nonarrangement regions to the fourth nonarrangement region are combined with the first nonarrangement region and preferably the third nonarrangement regions are combined with the second nonarrangement regions.

The shapes of the nonarrangement regions may be suitably set. For example, the first nonarrangement region may be formed not on the entire surface of the inner circumferential surface of the opening, but in only a portion of the circumferential direction and/or a portion in the penetration direction. Further, for example, the second nonarrangement region may be linear one which extends from the opening to the joining pad 261 as well. Further, for example, the second nonarrangement region (and third nonarrangement region) may have the same width as that of the joining pad 261 and have shape that extends from the opening to the joining pad 261 as well. Further, for example, the third nonarrangement region may have shape that surround the joining pad 261 with a relatively broad width to an extent that it does not extend along the margin of the joining pad 261. Further, for example, the fourth nonarrangement region needs not extend over the entire circumference of the opening and may be provided while dispersed at a plurality of positions on the edges of the opening.

Note that, preferably the solder resist is positioned among the plurality of joining pads, thereby short-circuiting between the joining pads is suppressed by the solder resist.

The first embodiment and the second embodiment may be suitably combined. For example, in the first embodiment, the solder resist may be provided on the mounting frame with an area and/or thickness so that the clearance between the package and the mounting frame, which communicates the second concave portion K2 and the external portion, is not completely closed. The through-hole conductor may be provided in the first embodiment, or the conductor 163 may be provided in the second embodiment.

Priorities are claimed on Japanese applications No. 2013-231325 filed on Nov. 7, 2013 and No. 2014-179027 filed on Sep. 3, 2014, the contents of which are incorporated herein by reference.

REFERENCE SIGNS LIST

110 . . . package
110a . . . substrate
110b . . . frame
111 . . . electrode pad
112 . . . joining terminal
113 . . . interconnect pattern
114 . . . via conductor
115 . . . connection pad
116 . . . connection pattern
117 . . . ground-use via conductor
118 . . . sealing conductor pattern
119 . . . measurement pad
120 . . . crystal element
121 . . . crystal element plate
122 . . . excitation-use electrode
123 . . . leadout electrode
130 . . . lid
131 . . . sealing member
140 . . . conductive adhesive
150 . . . integrated circuit element
151 . . . connection terminal
160 . . . mounting frame
161 . . . joining pad
162 . . . external terminal
163 . . . conductor
170 . . . insulating bonding material
180 . . . insulating resin
K1 . . . first concave portion
K2 . . . second concave portion
H . . . clearance portion

The invention claimed is:

1. A temperature compensated crystal oscillator comprising:
   a rectangular substrate,
   a frame which is provided on an upper surface of the substrate,
   a mounting frame which has an opening, which has joining pads which are provided along an outer circumferential edge of the upper surface and which is provided on a lower surface of the substrate by bonding of joining terminals which are provided along the outer circumferential edge of the lower surface of the substrate and the joining pads,
   a crystal element which is mounted on an electrode pad which is provided on the upper surface of the substrate in a region which is surrounded by the frame,
   an integrated circuit element which has a temperature sensor and which is mounted on a connection pad which is provided on the lower surface of the substrate in a region which is surrounded by the mounting frame,
   a lid which is joined to the upper surface of the frame,
   an interconnect pattern which is electrically connected to the electrode pad and is provided on the upper surface of the substrate, and
   a via conductor which is electrically connected to the interconnect pattern, which penetrates the substrate from the upper surface of the substrate to the lower surface of the substrate, which is provided at a position where the via conductor overlaps the mounting frame and is between the joining pads when viewed on a plane, and which is not electrically connected to conductors on the upper surface of the mounting frame including the joining pads.

2. The temperature compensated crystal oscillator according to claim 1, further comprising:
   a measurement pad which is provided on the lower surface of the substrate, wherein
   the via conductor is electrically connected to the measurement pad.

3. The temperature compensated crystal oscillator according to claim 2, further comprising an insulating resin in a clearance portion which is provided between the lower surface of the substrate and the upper surface of the mounting frame and which communicates the opening of the mounting frame and an external portion of the mounting frame and in a space between the integrated circuit element and the connection pad.

4. The temperature compensated crystal oscillator according to claim 3, wherein the insulating resin is provided so as to cover the lower surface of the via conductor.

* * * * *